United States Patent
Yoshida et al.

(10) Patent No.: US 8,678,808 B2
(45) Date of Patent: Mar. 25, 2014

(54) IMPRINT APPARATUS AND ARTICLE MANUFACTURING METHOD

(75) Inventors: Setsuo Yoshida, Saitama (JP); Noriyasu Hasegawa, Utsunomiya (JP); Yoshihiro Shiode, Utsunomiya (JP); Tatsuya Hayashi, Utsunomiya (JP)

(73) Assignee: Canon Kabushiki Kaisha (JP)

(*) Notice: Subject to any disclaimer, the term of this patent is extended or adjusted under 35 U.S.C. 154(b) by 95 days.

(21) Appl. No.: 13/268,351

(22) Filed: Oct. 7, 2011

(65) Prior Publication Data

US 2012/0086149 A1   Apr. 12, 2012

(30) Foreign Application Priority Data

Oct. 8, 2010  (JP) ................................ 2010-228830
Jul. 19, 2011  (JP) ................................ 2011-157719

(51) Int. Cl.
*B29C 59/02*  (2006.01)

(52) U.S. Cl.
USPC ........ 425/389; 425/385; 425/174.4; 425/139; 425/149; 425/150; 425/405.1; 264/40.5; 264/40.1; 264/293; 264/494; 264/1

(58) Field of Classification Search
USPC ........ 264/293, 40.1, 40.5, 494, 496; 425/385, 425/174.4, 139, 140, 149, 150, 389, 405.1, 425/388

See application file for complete search history.

(56) References Cited

U.S. PATENT DOCUMENTS

| | | | |
|---|---|---|---|
| 7,462,028 B2 | 12/2008 | Cherala et al. | |
| 2007/0114686 A1 | 5/2007 | Choi et al. | |
| 2007/0275114 A1* | 11/2007 | Cherala et al. | 425/405.1 |
| 2010/0244326 A1* | 9/2010 | Tokue et al. | 264/409 |

FOREIGN PATENT DOCUMENTS

| | | |
|---|---|---|
| JP | 4536148 B2 | 9/2009 |
| JP | 2009532245 A | 9/2009 |
| WO | 2007123805 A2 | 11/2007 |

* cited by examiner

*Primary Examiner* — Joseph S Del Sole
*Assistant Examiner* — Lawrence D Hohenbrink, Jr.
(74) *Attorney, Agent, or Firm* — Rossi, Kimms & McDowell LLP (57) ABSTRACT

The imprint apparatus of the present invention molds an imprint material on a substrate using a mold and cures the imprint material to form a pattern on the substrate. The apparatus includes a holder configured to attract the mold to hold the mold; and a pressure reduction device configured to reduce a back pressure of the mold held by the holder, wherein the apparatus is configured to reduce the back pressure by the pressure reduction device in parallel with release of the mold from the imprint material.

23 Claims, 6 Drawing Sheets

MOLD CONTACTING PROCESS

IMPRINT APPARATUS AND ARTICLE MANUFACTURING METHOD

BACKGROUND OF THE INVENTION

1. Field of the Invention

The present invention relates to an imprint apparatus and an article manufacturing method using the same.

2. Description of the Related Art

As the demand for microfabrication of semiconductor devices increases, not only a conventional photolithography technology but also a microfabrication technology in which a mold and an uncured resin on a substrate are pressed against each other to thereby form a resin pattern, which corresponds to the fine concave and convex pattern formed on the mold, on the substrate exist. This technology is also referred to as an "imprint technology", by which a fine structure with dimensions of a few nanometers can be formed on the substrate. One example of imprint technologies includes a photo-curing method. The photo-curing method first applies an ultraviolet curable resin (imprint resin, photocurable resin) to the shot area (imprint area) on the substrate. Next, the resin (uncured resin) and a mold are pressed against each other. After the ultraviolet curable resin is irradiated with ultraviolet light for curing, the cured resin is released from the mold, whereby a resin pattern is formed on the substrate.

In the conventional imprint apparatus employing the aforementioned technique, air bubbles may be entrapped in a resin pattern-forming unit when a mold is pressed against a resin on a substrate. When the resin is cured with entrapped air bubbles, defects may occur on the pattern to be formed. In order to avoid such a pattern defect, U.S. Patent Publication No. 2007/0114686 discloses a method for discharging gas between a substrate and a mold in which the mold is temporarily deflected toward the substrate in a convex shape, a resin on the substrate is pressed against the mold in this state, and the mold is then restored to a flat surface so as to press the entire pattern surface against the resin. According to the method, gas present between a mold and a resin may be expelled to the outside, and thus, air bubbles entrapped in a resin may be reduced. Furthermore, Japanese Patent Laid-Open No. 2009-532245 discloses an apparatus that depressurizes a space between a mold and a substrate to thereby reduce the remaining entrapped air bubbles.

Furthermore, in the conventional imprint apparatus, if the entire surface of the mold is peeled off from the cured resin, at which an imprinting operation was performed, at the same time upon mold releasing, a large peel-off stress may be instantaneously applied at the interface (contact portion) between the mold and the cured resin. This stress may lead to the distortion of a pattern to be formed, resulting in a pattern defect. In contrast, in the method disclosed in U.S. Patent Publication No. 2007/0114686, a mold is temporarily deformed in a manner similar as mentioned above and the mold is gradually peeled off from the periphery of a cured resin pattern-forming unit upon the release of the mold, whereby the occurrence of a sharp stress may be avoided.

However, when a mold is deformed and released from the periphery of the resin pattern as in the method disclosed in U.S. Patent Publication No. 2007/0114686, the resin pattern is inclined by being pushed by the concave and convex pattern of a deflected mold, and thus, a stress occurs on the root portion thereof. When the stress becomes larger than a resin plastic stress, the resin pattern is kept inclined and may not be restored back to its original shape. Furthermore, in the mold disclosed in U.S. Patent Publication No. 2007/0114686, the portion including the concave and convex pattern is made thin so as to be readily deflected. In this case, the mold is largely deformed upon the release of the mold, and thus, the inclination of the resin pattern as described above readily and undesirably occurs.

Also, in the apparatus disclosed in Japanese Patent Laid-Open No. 2009-532245, a recovery port for recovering gas is provided in a space between a mold and a substrate so as to depressurize the space therebetween. In this case, the depressurization of the space between the mold and the substrate exerts force such that the mold and the substrate are being close to each other. This force may bring the recovery port and the substrate into contact with each other before gas present in the space between the mold and the substrate is pushed out by bringing the mold into contact with the substrate. When coming into such a state, gas may be entrapped in the space between the mold and the substrate. Consequently, the concave portion of the mold may not be completely filled with an imprint material due to the presence of gas, resulting in the occurrence of defects. Furthermore, a defect from the inclination of the resin pattern formed on the substrate readily occurs due to the deformation of the mold.

SUMMARY OF THE INVENTION

Accordingly, the present invention provides, for example, an imprint apparatus that is advantageous in terms of limiting deformation of a mold or obtaining a target deformation state of a mold.

According to an aspect of the present invention, an imprint apparatus that molds an imprint material on a substrate using a mold and cures the imprint material to form a pattern on the substrate is provided that includes a holder configured to attract the mold to hold the mold; and a pressure reduction device configured to reduce a back pressure of the mold held by the holder, wherein the apparatus is configured to reduce the back pressure by the pressure reduction device in parallel with release of the mold from the imprint material.

According to the present invention, for example, an imprint apparatus that is advantageous in terms of limiting deformation of a mold or obtaining a target deformation state of a mold may be provided.

Further features of the present invention will become apparent from the following description of exemplary embodiments with reference to the attached drawings.

DESCRIPTION OF THE EMBODIMENTS (First Embodiment)

Figure 1:
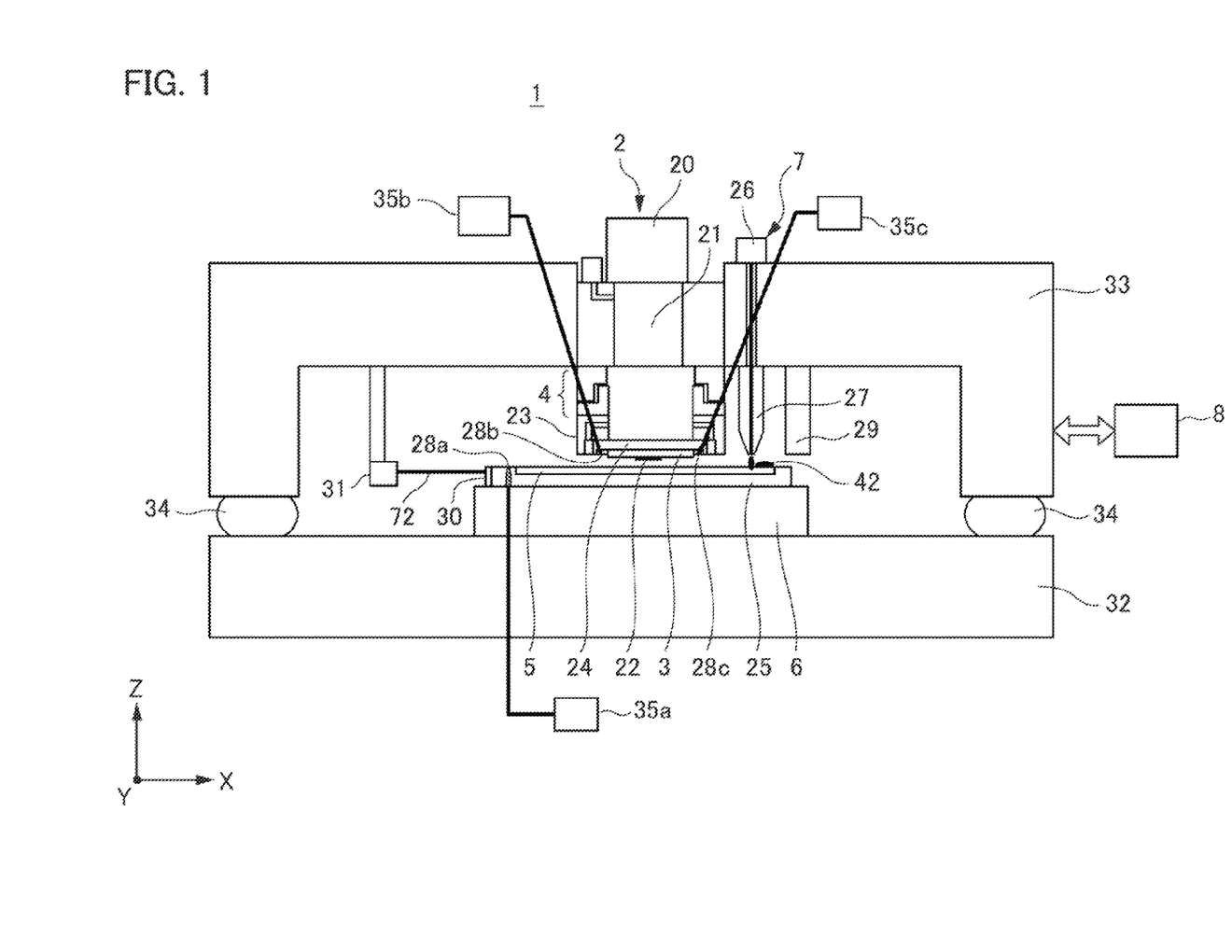
FIG. 1 is a schematic view illustrating the configuration of an imprint apparatus according to a first embodiment of the present invention.

Firstly, a description will be given of the configuration of an imprint apparatus according to an embodiment of the present invention. FIG. 1 is a schematic view illustrating the configuration of an imprint apparatus. The imprint apparatus according to the present embodiment is a processing apparatus that transfers the concave and convex pattern of a mold onto a wafer (a substrate), i.e., a treatment object substrate, which is used for a semiconductor device manufacturing process, and is an apparatus that employs a photo-curing method used in imprint technologies. In the following drawings, a description will be given where the Z axis is aligned in parallel to the irradiation axis of ultraviolet light for a mold, the X axis is aligned in the direction in which a wafer moves with respect to a mold base, to be described below, in a plane perpendicular to the Z axis, and the Y axis is aligned in the direction perpendicular to the X axis. Firstly, the imprint apparatus 1 of the present invention includes an illumination unit 2, a mold holding device 4, a wafer stage 6, an application unit 7, and a controller 8.

The illumination unit 2 is an illumination unit configured to irradiate the mold 3 with ultraviolet light during imprinting processing. The illumination unit 2 is constituted by a light source 20 and an illuminating optical system 21 that adjusts ultraviolet light emitted from the light source 20 to a light suitable for imprinting. As the light source 20, a halogen lamp that emits ultraviolet light may be employed. Also, the illuminating optical system 21 includes an optical element such as a lens, an aperture (opening), a shutter for switching between light irradiation and light shielding, and the like.

The mold 3 has a rectangular outer periphery and is a mold having a mesa portion 22 in which a predetermined pattern (e.g., concave and convex pattern such as circuit pattern or the like) is three-dimensionally formed. In particular, the mold 3 of the present embodiment is configured such that the area where the mesa portion 22 is arranged has a thickness less than that of the remaining peripheral portion. Details of the shape of the mold 3 will be described below. The surface of the concave and convex pattern is processed at high flatness so as to maintain the adhesion between the wafer 5 and the surface. The material of the mold 3 is a material such as quartz or the like through which ultraviolet light can pass.

The mold holding device 4 is a holder configured to hold the mold 3. The mold holding device 4 includes a shape correction mechanism (magnification correction mechanism) 23, a mold base (holder or mold holder) 24 for drawing and holding the mold 3 using suction force or electrostatic force, and a base driving mechanism (not shown) for driving the mold base 24. The shape correction mechanism 23 is an apparatus that corrects the pattern formed on the mold 3 into the desired shape by applying a compressive force to the mold 3, and consists of a plurality of driving mechanisms that are placed at respectively opposite positions relative to the area of the peripheral side surface of the mold 3. The configuration of the shape correction mechanism 23 is not limited thereto. For example, the shape correction mechanism 23 may apply a tensile force to the mold 3 or may apply a shear force to the contact surface between the mold 3 and the mold base 24 by driving a mold base 24 itself. A base driving mechanism is a driving system that drives the mold base 24 in the Z-axial direction so as to press the mold 3 against an ultraviolet curable resin applied on the wafer 5. An actuator employed for the driving mechanism is not particularly limited. A linear motor, an air cylinder, and the like may be employed. In the imprint apparatus 1 of the present embodiment, the mold 3 is pressed against an ultraviolet curable resin on the fixed wafer 5. In contrast, an ultraviolet curable resin on the wafer 5 may be pressed against the fixed mold 3.

Figure 2A:
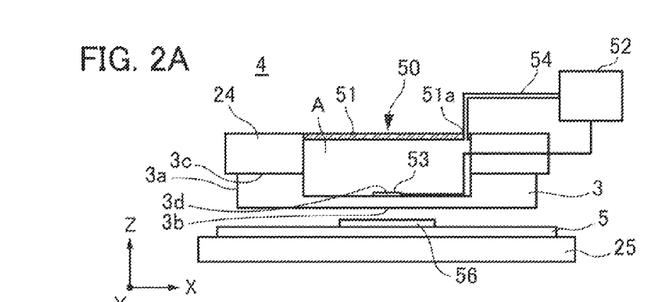
FIG. 2A is a schematic view illustrating the configuration of a mold holding device according to the first embodiment of the present invention.

Furthermore, the mold holding device 4 of the present embodiment includes a mold deformation mechanism (deformation mechanism) 50 for deforming the shape of the mold 3 in addition to the configuration described above. FIG. 2A is a schematic view illustrating the configuration of a mold deformation mechanism 50. In the following drawings including FIG. 2A, the same elements as those in the imprint apparatus 1 shown in FIG. 1 are designated by the same reference numerals and explanation thereof will be omitted. In the present embodiment, the shape of the mold 3 is a boxed-shape having a wall portion 3a at the outer periphery thereof, and a concave and convex pattern as described above is formed at a central portion 3b of the imprint surface of the mold 3. In this case, the mold base 24 of the mold holding device 4 has a space formed at the central portion (inside) thereof such that ultraviolet light emitted from the light source 20 of the illumination unit 2 passes therethrough, and holds the mold 3 by the suction adsorption of the vertical plane 3c of the wall portion 3a which is the outer peripheral portion of the mold 3.

Firstly, the mold deformation mechanism 50 of the present embodiment includes a sealing member 51 with which a space area "A" formed by the space present in the mold base 24 and the internal space surrounded by the wall portion 3a of the mold 3 is defined as a sealed space. Also, the mold deformation mechanism 50 includes a pressure adjusting device (pressure applying unit, pressure reduction device, or back pressure control unit) 52 that is placed at the exterior of the mold holding device 4 and adjusts the pressure in the space area "A", that is, the back pressure of the inner surface 3d (the opposite side of the imprint surface) of the central portion of the mold 3. Furthermore, the mold deformation mechanism 50 includes a distortion measuring device (measuring device) 53 that is placed in the inner surface 3d and measures distortion (strain) that has occurred at the mold 3. The sealing member 51 is formed by a light-transmitting planar member such as quartz glass, and partially includes a connection port 51a of a tube 54 to be connected to the pressure adjusting device 52. Also, the distortion measuring device 53 is a deformation measuring device that is constituted by a distortion gauge or the like to be connected to the pressure adjusting device 52 so as to measure the deformation of the mold 3. The distortion measuring device 53 transmits measurement information as an electrical signal to the pressure adjusting device 52 via a detection circuit such as a bridge circuit (not shown).

The wafer 5 is a treatment object substrate consisting of, for example, a single crystal silicon, and the ultraviolet curable resin (hereinafter referred to simply as "resin"), which serves as a portion to be molded, is applied on the treatment surface. Also, the wafer stage 6 is a substrate holder configured to hold the wafer 5 by vacuum suction and be freely moveable in the XY plane. The wafer stage 6 includes an auxiliary member (chuck) 25 for directly holding the wafer 5, and an actuator for driving an assisting member 25. The wafer stage 6 also includes a mechanism (not shown) that not only performs accurate positioning for overlapping the pattern but also adjusts the attitude of the surface of the wafer 5.

The application unit (dispenser) 7 is an application unit configured to apply an uncured resin onto the wafer 5. The application unit 7 includes a housing section 26 for containing an uncured resin, and a supply port 27 that communicates with the housing section 26 so as to apply an uncured resin supplied from the housing section 26 onto the wafer 5. A resin is a photocurable resin having the property of being cured by irradiation of ultraviolet light, and is appropriately selected by the type of a semiconductor device to be manufactured.

The controller 8 is a control unit configured to control the operation, adjustment, and the like of the components of the imprint apparatus 1. The controller 8 (not shown) is constituted by a computer, a sequencer, or the like having a storage unit such as a magnetic storage medium or the like that is connected to the components of the imprint apparatus 1 through a line, and executes control of the components by a program or a sequence. Note that the controller 8 may be integrated with the imprint apparatus 1, or may be installed at a location separate from the location where the imprint apparatus 1 is installed to thereby be controlled remotely.

Also, the imprint apparatus 1 includes gas supplying devices (gas supplying units) 35a to 35c that supply gas to the space between the mold 3 and the wafer 5 during a mold contacting operation. In general, if air bubbles remain in the space between the concave and convex pattern 22 formed on the mold 3 and the resin on the wafer 5 during a mold contacting operation, the pattern to be formed on the resin is distorted, resulting in the occurrence of defects. Thus, the gas supplying device supplies a purge gas such as helium, carbon dioxide, or the like having high solubility to a resin so as to suppress the occurrence of air bubbles. The gas supplying devices 35a to 35c respectively include first to third gas supply ports 28a to 28c that are arranged around the mold 3. Each of the first to third gas supply ports 28a to 28c ejects purge gas at least immediately prior to a mold contacting operation so as to increase the concentration of purge gas around the mold 3 as much as possible.

Furthermore, the imprint apparatus 1 includes an interferometer distance measuring device for measuring the position of the wafer stage 6, and an alignment scope 29 for measuring the position of the alignment mark formed on the wafer 5. The interferometer distance measuring device includes a mirror 30 and an interferometer 31 that are arranged at the end of the wafer stage 6. The controller 8 drives the wafer stage 6 to the target position based on the measurement result obtained by the interferometer distance measuring device. The controller 8 also performs the positioning of the wafer stage 6 based on the position of the alignment mark on the wafer 5, which has been measured by the alignment scope 29. The imprint apparatus 1 further includes a surface plate 32, a frame 33, and an anti-vibration device 34. The surface plate 32 supports the entire imprint apparatus 1 and forms a reference plane for the movement of the wafer stage 6. The frame 33 supports various components that are located above the wafer 5. The anti-vibration device 34 supports the frame 33 and has a function that reduces vibration transfer from the floor as well.

Next, imprint processing performed by the imprint apparatus 1 will now be described. First, the controller 8 places the wafer 5 on the wafer stage 6 using a wafer conveyance system (not shown), and then holds the wafer 5 on the assisting member 25 by means of a vacuum suction unit (not shown) configured on the wafer stage 6. Next, the controller 8 drives the wafer stage 6 as appropriate and simultaneously and sequentially measures the alignment mark on the wafer 5 using the alignment scope 29 to thereby acquire positional information about the wafer 5. The controller 8 computes transfer coordinates from the acquired positional information. The transfer coordinates are employed as the reference of a serial transfer (mold contacting operation or processing) or a resin application operation for each predetermined shot (area to be transferred). Next, the controller 8 moves the wafer stage 6 such that the target shot on the wafer 5 is placed in a position directly below the supply port 27 for a resin. Then, the application unit 7 applies an appropriate quantity of a resin (uncured resin) from the supply port 27 to the target shot. Next, after the imprint surface of the mold 3 is aligned with the coating surface on the wafer 5 and the shape of the mold 3 is corrected using the shape correction mechanism 23, the controller 8 drives the base driving mechanism so as to press the mold 3 against the resin on the wafer 5. The completion of a mold contacting operation is determined by the controller 8 based on the measurement value obtained by a load sensor that is placed within the interior of the mold holding device 4. During the mold contacting operation, the resin flows along the concave and convex pattern formed on the mold 3. Under this condition, the illumination unit 2 emits ultraviolet light from the top surface of the mold 3, and the resin is cured by the ultraviolet light that has been transmitted through the mold 3. After the resin is cured, the controller 8 again drives the base driving mechanism to thereby release the mold 3 from the wafer 5 (mold releasing operation or processing). By the aforementioned steps, a three dimensionally shaped resin layer following the pattern of the mold 3 is formed on the shot surface of the wafer 5.

Figure 7A:
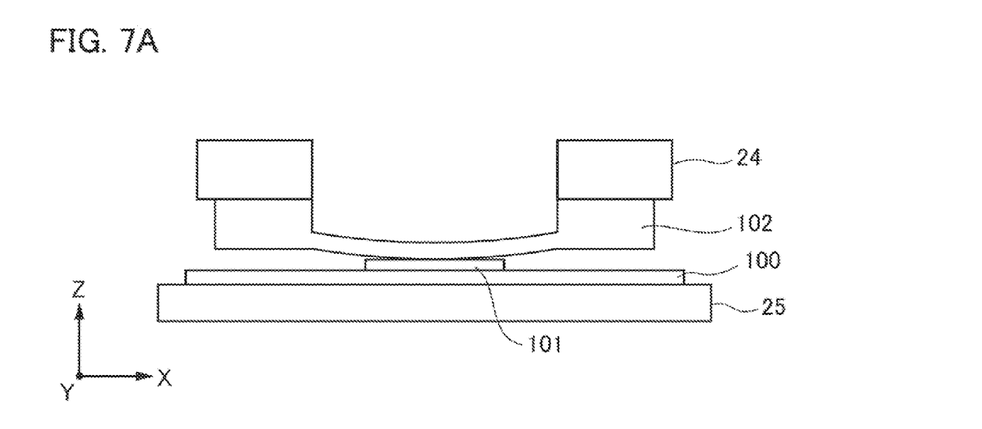
FIG. 7A is a schematic view illustrating the operation in the midst of releasing a mold from a resin layer formed on a wafer during a mold releasing operation.

Next, the effect of the mold holding device 4, which is a feature of the present embodiment, will be described. Firstly, a mold releasing operation performed by a conventional imprint apparatus will be described for comparison. FIG. 7 is a schematic diagram illustrating a mold releasing operation performed by a conventional imprint apparatus. In particular, FIG. 7A is a schematic view illustrating the operation in the course of releasing a mold 102 (a concave and convex pattern 103) from a resin 101 formed on a wafer 100 during a mold releasing operation. In general, when the mold 102 is released from the wafer 100, the mold 102 is subject to force in a direction away from the wafer 100, that is, an upward direction along the Z-axis. At the same time, in the area where the concave and convex pattern 103 and the resin layer 101 are fixedly attached to each other, the mold 102 is subject to a force in a direction toward the wafer 100, that is, a peel-off stress in a downward direction along the Z-axis. Thus, in the conventional imprint apparatus, since the mold 102 is deformed into an inverted pot shape which is convex in a direction toward the wafer 100 as shown in FIG. 7A, the concave and convex pattern 103 is gradually peeled off from the circumference of the resin layer 101 so as to avoid the abrupt occurrence of the peel-off stress.

Figure 7B:
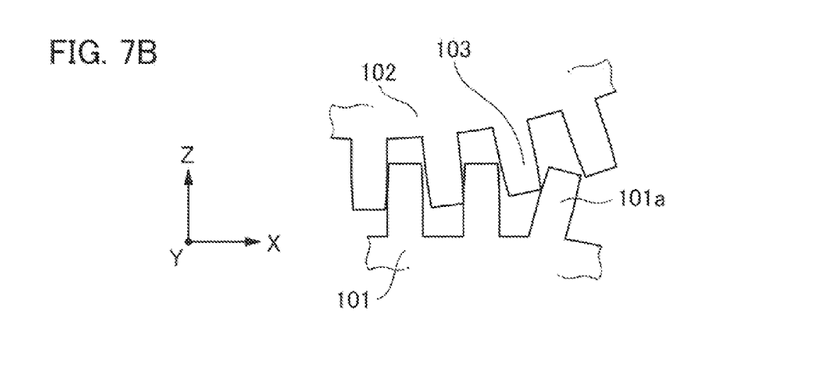
FIG. 7B is an enlarged view illustrating the vicinity of a pattern-forming unit shown in FIG. 7A.
Figure 7C:
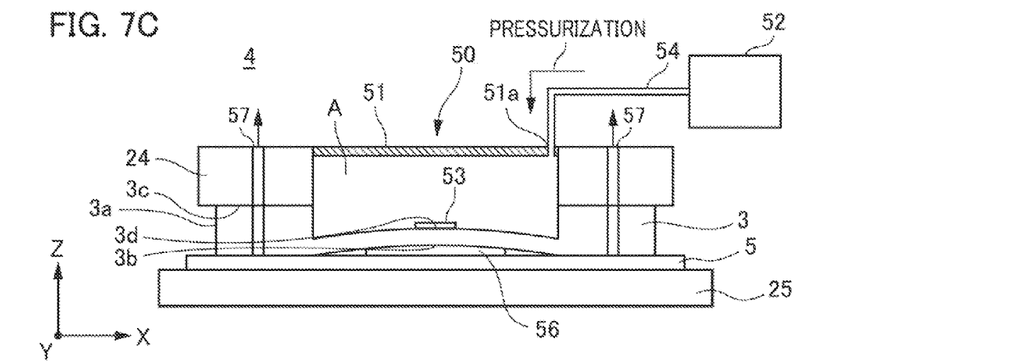
FIG. 7C is a schematic view illustrating the state of a mold holding device upon start of operation for comparison.

FIG. 7B is an enlarged view illustrating the vicinity of a pattern-forming unit shown in FIG. 7A. As shown in FIG. 7B, when the concave and convex pattern 103 is gradually peeled off from the circumference of the resin layer 101, the stripping portion of the concave and convex pattern 103 is inclined in the oblique direction with respect to the Z direction (mold-releasing direction) as the mold 102 is deformed. Owing to the inclination of the stripping portion, the pattern-forming unit 101a of the resin layer 101, which is adjacent the stripping portion, is likewise inclined by pressing, whereby stress occurs at the root portion thereof. If the stress becomes greater than the resin plastic stress, the pattern-forming unit 101a is left inclined and never restores to the original shape.

Figure 2B:
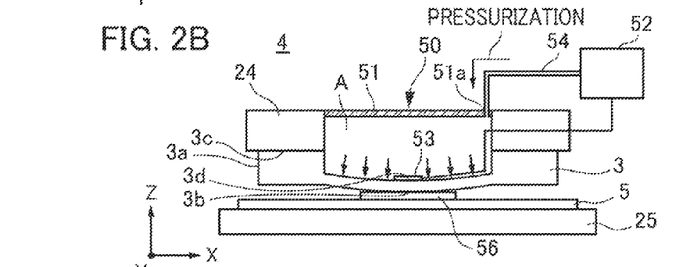
FIG. 2B is a schematic view illustrating the state of a mold deformation mechanism during a mold contacting operation.

In contrast, in the mold holding device 4 of the present embodiment, the aforementioned mold deformation mechanism 50 is employed so as to reduce air bubbles entrapped in a resin 56 and to decrease the collapse of the resin 56 in the pattern-forming unit as well. FIG. 2B is a schematic view illustrating the state of the mold deformation mechanism 50 during a mold contacting operation. Firstly, during a mold contacting operation, the mold deformation mechanism 50 supplies gas in the space area "A" and pressurizes the mold 3 by means of the pressure adjusting device 52. In other words, the back pressure of the mold 3 is rendered at a positive pressure. In this manner, as shown in FIG. 2B, since the surface of the central portion of the mold 3 is made thin compared to the thickness of the wall portion 3a, the surface is deformed into a convex shape toward the wafer 5. Next, as the mold holding device 4 brings the mold 3 into relative contact with the resin (uncured resin) 56 applied on the wafer 5, the mold deformation mechanism 50 decreases the pressure in the space area "A" using the pressure adjusting device 52 so as to gradually restore the central portion of the mold 3 to a planar shape. Here, the mold 3 is distorted by being brought into contact with the wafer 5 (the resin 56). The distortion measuring device 53 measures the distortion and transmits measurement information to the pressure adjusting device 52. The pressure adjusting device 52 adjusts the pressure in the space area "A" based on measurement information such that the central portion of the mold 3 is distorted in a convex shape toward the wafer 5 during a mold contacting operation. The pressure adjusting device 52 adjusts the pressure in the space area "A" such that the mold 3 is brought into parallel contact with the wafer 5 immediately before the end of the mold contacting operation or on termination of the mold contacting operation so as to gradually restore the central portion of the mold 3 back from a convex shape to a planar shape. In this manner, the imprint apparatus 1 expels gas present between the mold 3 and the resin 56 to the outside, and thus, an imprinting operation may be carried out while reducing air bubbles entrapped in the resin 56. Then, as described above, the imprint apparatus 1 performs the curing operation of the resin 56 by means of the irradiation of ultraviolet light.

Figure 2C:
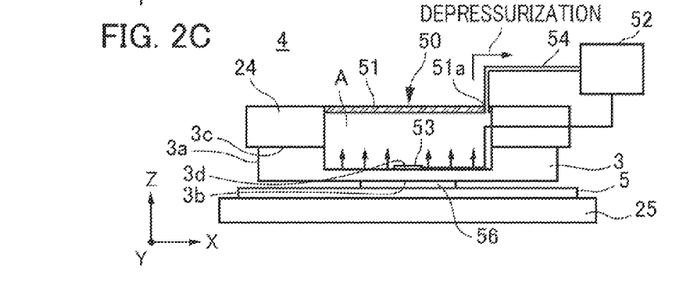
FIG. 2C is a schematic view illustrating the state of a mold deformation mechanism during a mold releasing operation.

On the other hand, FIG. 2C is a schematic view illustrating the state of the mold deformation mechanism 50 during a mold releasing operation. In general, during a mold releasing operation, the mold 3 is subject to a pulling force in a direction toward the wafer 5 so as to be deformed into a convex shape toward the wafer 5. In other words, distortion, which is a physical quantity correlated with the deformation of the mold 3 (deflection), occurs in the inner surface 3d of the central portion of the mold 3 due to the pulling force. Accordingly, the distortion measuring device 53 measures the amount of distortion at this time and transmits it as measurement information (output) to the pressure adjusting device 52. Next, in response to measurement information, the pressure adjusting device 52 evacuates gas from the space area "A" so as to reduce the back pressure of the mold 3 in parallel with a mold releasing operation. In other words, during a mold releasing operation, the pressure adjusting device 52 may adjust the pressure in the space area "A" so as to reduce the amount of distortion to be measured by the distortion measuring device 53. In this manner, pressure is exerted on the inner surface 3d of the central portion of the mold 3 in the direction away from the wafer 5, that is, in the direction opposite to the direction of the pulling force, resulting in the reduction in the deformation of the mold 3 due to the pulling force. Then, the mold holding device 4 retracts the mold 3 relative to the resin (cured resin) 56 while maintaining this state. Hence, the deformation of the mold 3 is suppressed during a mold releasing operation, and thus, the collapse of the resin 56 in the pattern-forming unit, which is caused by the deformation, is decreased.

Figure 2D:
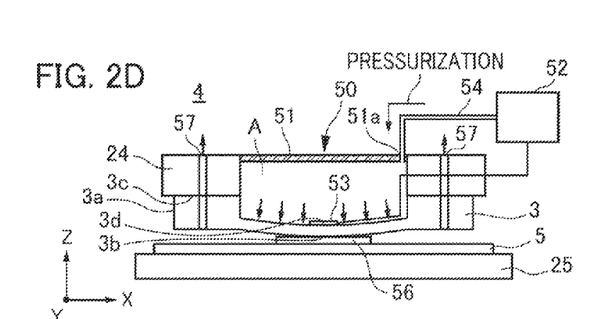
FIG. 2D is a schematic view illustrating a variant example of a mold holding device according to the first embodiment of the present invention.

In the present embodiment, as a method for reducing the amount of air bubbles entrapped between the mold 3 and the resin 56 during a mold contacting operation, a description has been given by taking an example in which the pressure adjusting device 52 supplies gas to the space area "A" so as to render the back pressure of the mold 3 at a positive pressure so that the central portion of the mold 3 is deformed into a convex shape toward the wafer 5. Here, FIG. 2D is a schematic view illustrating a variant example of a mold holding device that is advantageous for reducing the amount of air bubbles entrapped between the mold 3 and the resin 56 during a mold contacting operation. A recovery port (recovery unit) 57 for recovering gas in the space between the mold 3 and the wafer 5 is provided in, for example, the mold holding device 4. The recovery port 57 reduces the pressure in the space between the mold 3 and the wafer 5 to a pressure that is lower than the ambient pressure. With this arrangement, the amount of gas present in the space between the mold 3 and the wafer 5 is decreased so that the amount of air bubbles entrapped can be reduced as compared with the state of ambient pressure. The recovery port 57 may be provided in at least one of the mold base 24 or the auxiliary member (chuck) 25.

However, merely providing the recovery port 57 is insufficient. By reducing the pressure in the space between the mold 3 and the wafer 5 to a pressure that is lower than the ambient pressure, a force is applied to the mold 3 and the wafer 5 so as to bring them close to each other. This force may bring the recovery port and the substrate into contact with each other before gas present in the space between the mold and the substrate is pushed out. When coming into such a state, gas may be entrapped in the space between the mold 3 and the wafer 5, and thus, the amount of air bubbles entrapped cannot be sufficiently decreased. Hence, as described above, even when such a force is produced by the recovery port 57 during a mold contacting operation, the pressure adjusting device 52 adjusts the back pressure of the space area "A" to the positive pressure based on the measurement information obtained from the distortion measuring device 53 such that the central portion of the mold 3 is deformed into a convex shape toward the wafer 5. This avoids or reduces the possibility of the recovery port 57 coming into contact with the wafer 5 before the gas present in the space between the mold 3 and the wafer 5 is pushed out. In this way, a mold contacting operation functions in a suitable way while reducing the pressure in the space between the mold 3 and the resin 56. Consequently, the amount of air bubbles entrapped in the space can be reduced to an amount that is lower than that during a mold contacting operation under the ambient pressure environment.

Also, a base driving mechanism (not shown) may control the amount of movement or the speed of movement of the mold 3 in the Z direction based on the measurement information obtained from the distortion measuring device 53 such that the central portion of the mold 3 is deformed into a convex shape toward the wafer 5. Furthermore, the force to act on between the mold 3 and the wafer 5 may be controlled by adjusting the gas recovery amount from the recovery port 57 based on the measurement information obtained from the distortion measuring device 53 such that the central portion of the mold 3 is deformed into a convex shape toward the wafer 5.

Figure 2E:
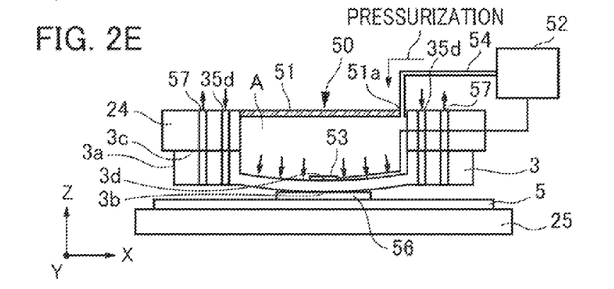
FIG. 2E is a schematic view illustrating a variant example of a mold holding device according to the first embodiment of the present invention.

Furthermore, as shown in FIG. 2E, a gas supplying device 35d (supply port) for supplying gas to the space between the mold 3 and the wafer 5 may also be provided. The force acting between the mold 3 and the wafer 5 is controlled by supplying gas from the gas supplying device 35d based on the measurement information obtained from the distortion measuring device 53 such that the central portion of the mold 3 is deformed into a convex shape toward the wafer 5. At this time, gas to be supplied exhibits a high solubility with respect to the resin 56 described above. It is preferable that the position of the gas supplying device 35d is located in the mold base 24 and inside the recovery port 57 (located toward the middle of the mold 3 being held).

As described above, according to the imprint apparatus 1 of the present embodiment, air bubbles entrapped in a resin (the amount of air bubbles entrapped) may be reduced during a mold contacting operation and the collapse of the resin in the pattern-forming unit can be reduced during a mold releasing operation.

(Second Embodiment)

Figure 3:
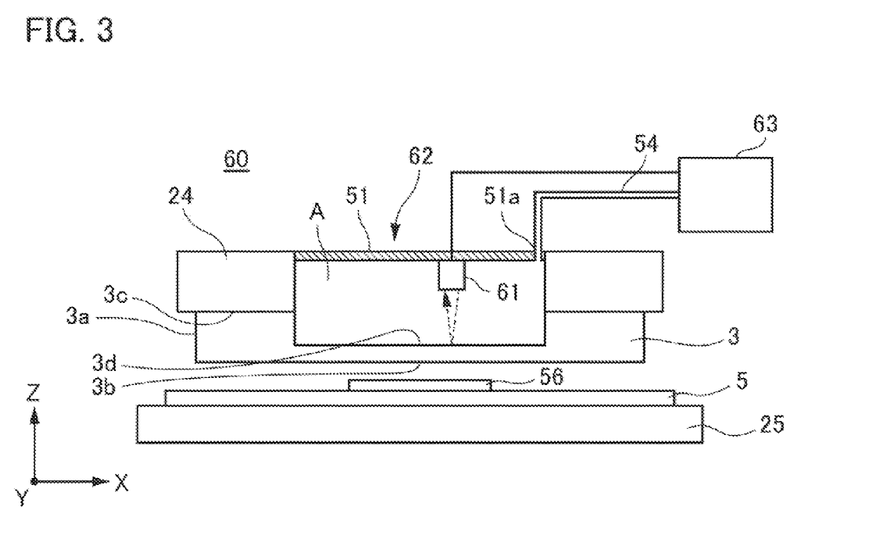
FIG. 3 is a schematic view illustrating the configuration of a mold holding device according to a second embodiment of the present invention.

Next, a description will be given of an imprint apparatus according to a second embodiment of the present invention. FIG. 3 is a schematic view illustrating the configuration of a mold holding device 60 which is the feature of the present embodiment. In FIG. 3, the same elements as those in the mold holding device 4 shown in FIG. 2A are designated by the same reference numerals and explanation thereof will be omitted. A feature of the mold holding device 60 lies in the fact that it includes a mold deformation mechanism 62 having a position measuring device (measuring device) 61 instead of the distortion measuring device 53 having the mold deformation mechanism 50 of the first embodiment. Also, the mold deformation mechanism 62 includes a pressure adjusting device 63 that is provided on the exterior of the mold holding device 60 and adjusts the pressure in the space area "A" serving as a sealed space. For example, the position measuring device 61 is a deformation measuring device constituted by a laser interferometer or the like, and is installed on a surface brought into contact with the space area "A" of the sealing member 51. In this case, the position measuring device 61 may be provided at a plurality of locations. The position measuring device 61 acquires measurement information about one or more locations by receiving a laser beam reflected from the inner surface 3d of the central portion of the mold 3, and transmits the measurement information as an electrical signal to the pressure adjusting device 63. In the present embodiment, a description will be given by taking an example in which the position measuring device 61 is applied to the first embodiment. Thus, an imprint apparatus may be provided that may reduce the amount of air bubbles entrapped during a mold contacting operation as in the first embodiment and reduce the collapse of the pattern during a mold releasing operation.

In the mold deformation mechanism 62, distortion in the inner surface 3d of the central portion of the mold 3 occurs during an imprinting operation including a mold contacting operation and a mold releasing operation. At this time, the position measuring device 61 measures the amount of change in position and transmits it as measurement information to the pressure adjusting device 63. Next, in response to measurement information, the pressure adjusting device 63 supplies gas in the space area "A" or evacuates gas in the space area "A" so as to increase or decrease the back pressure. In other words, during a mold contacting operation, the pressure adjusting device 63 may adjust the pressure in the space area "A" based on the amount of change in position measured by the position measuring device 61 such that the mold 3 is maintained so as to be convex toward the wafer 5. Also, during a mold releasing operation, the pressure adjusting device 63 may adjust the pressure in the space area "A" such that the amount of change in position measured by the position measuring device 61 is reduced. Other operations performed by the mold deformation mechanism 62 are similar to those performed by the mold deformation mechanism 50 of the first embodiment. As described above, according to an imprint apparatus including the mold holding device 60 of the present embodiment, the same effects as those of the imprint apparatus of the first embodiment may be provided.

(Third Embodiment)

Figure 4:
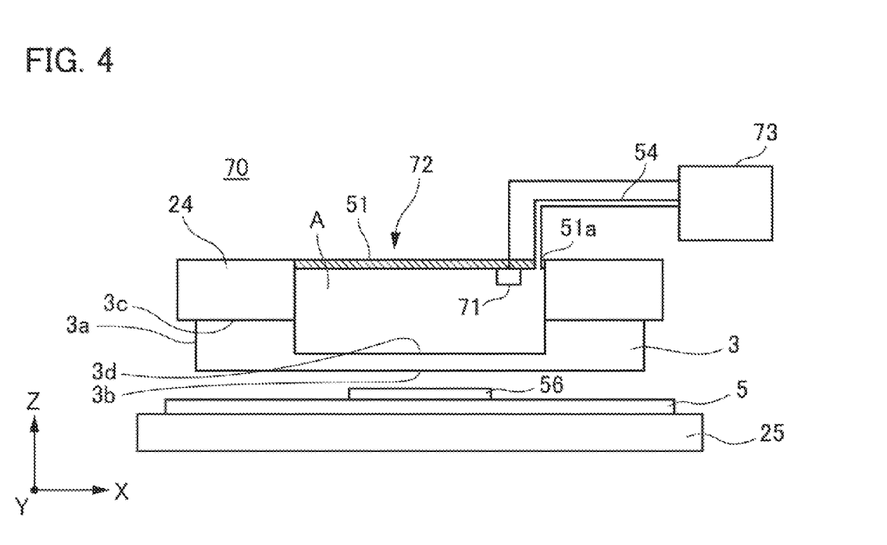
FIG. 4 is a schematic view illustrating the configuration of a mold holding device according to a third embodiment of the present invention.

Next, a description will be given of an imprint apparatus according to a third embodiment of the present invention. FIG. 4 is a schematic view illustrating the configuration of a mold holding device 70 which is the feature of the present embodiment. In FIG. 4, the same elements as those in the mold holding device 4 shown in FIG. 2A are designated by the same reference numerals and explanation thereof will be omitted. A feature of the mold holding device 70 lies in the fact that it includes a mold deformation mechanism 72 having a pressure measuring device (measuring device) 71 instead of the distortion measuring device 53 having the mold deformation mechanism 50 of the first embodiment. Also, the mold deformation mechanism 72 includes a pressure adjusting device 73 that is provided on the exterior of the mold holding device 70 and adjusts the pressure in the space area "A" serving as a sealed space. For example, the pressure measuring device 71 is a deformation measuring device constituted by a pressure sensor or the like, and is installed on a surface brought into contact with the space area "A" of the sealing member 51. In this case, the pressure measuring device 71 measures the pressure in the space area "A" and acquires measurement information about it so as to transmit measurement information as an electrical signal to the pressure adjusting device 73. In the present embodiment, a description will be given by taking an example in which the pressure measuring device 71 is applied to the first embodiment. Thus, an imprint apparatus may be provided that may reduce the amount of air bubbles entrapped during a mold contacting operation as in the first embodiment and reduce the collapse of the pattern during a mold releasing operation.

Firstly, in the mold deformation mechanism 72, the mold 3, which is convex toward the wafer 5, is brought into contact with the wafer 5 during a mold contacting operation. Thus, the volume in the space area "A" may change, resulting in a change in the pressure in the space area "A". At this time, the pressure measuring device 71 measures the amount of change in pressure and transmits it as measurement information to the pressure adjusting device 73. The pressure adjusting device 73 may adjust the pressure in the space area "A" based on measurement information such that the mold 3 is maintained so as to be convex toward the wafer 5. Also, since distortion in the inner surface 3d of the central portion of the mold 3 occurs during a mold releasing operation, the volume in the space area "A" may change, resulting in a change in the pressure therein. Thus, the pressure measuring device 71 measures the amount of change in pressure at this time and transmits it as measurement information to the pressure adjusting device 73. Next, in response to measurement information, the pressure adjusting device 73 evacuates gas in the space area "A" so as to decrease the back pressure. In other words, during a mold releasing operation, the pressure adjusting device 73 may adjust the pressure in the space area "A" such that the amount of change in pressure measured by the pressure measuring device 71 is reduced. Other operations performed by the mold deformation mechanism 72 are similar to those performed by the mold deformation mechanism 50 of the first embodiment. As described above, according to an imprint apparatus including the mold holding device 70 of the present embodiment, the same effects as those of the imprint apparatus of the first embodiment may be provided.

(Fourth Embodiment)

Figure 5:
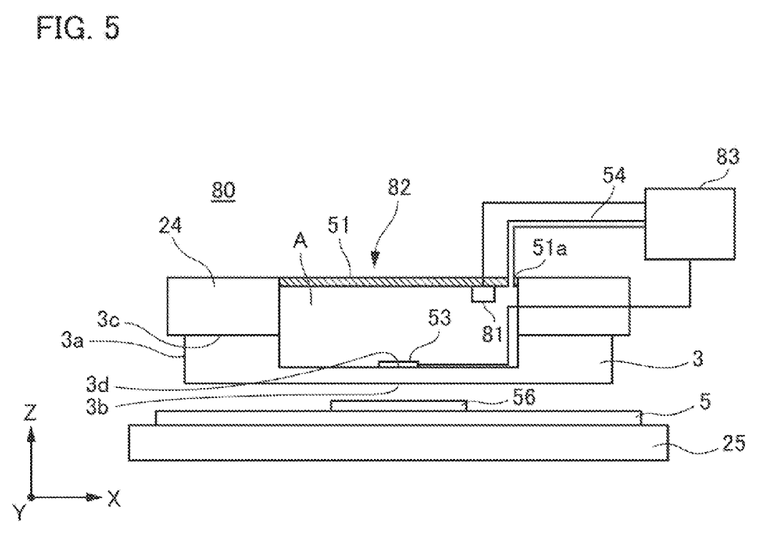
FIG. 5 is a schematic view illustrating the configuration of a mold holding device according to a fourth embodiment of the present invention.

Next, a description will be given of an imprint apparatus according to a fourth embodiment of the present invention. FIG. 5 is a schematic view illustrating the configuration of a mold holding device 80 which is the feature of the present embodiment. In FIG. 5, the same elements as those in the mold holding device 4 shown in FIG. 2A are designated by the same reference numerals and explanation thereof will be omitted. A feature of the mold holding device 80 lies in the fact that it has the same configuration of the mold deformation mechanism 50 of the first embodiment and includes a mold deformation mechanism 82 having a resin range measuring device (measuring device) 81. Also, the mold deformation mechanism 82 includes a pressure adjusting device 83 that is provided on the exterior of the mold holding device 80 and adjusts the pressure in the space area "A" serving as a sealed space. For example, the resin range measuring device 81 is a deformation measuring device constituted by an image sensing element or the like, and is installed on a surface brought into contact with the space area "A" of the sealing member 51. In this case, the resin range measuring device 81 detects the range of the resin 56 applied on the wafer 5 or the range where the mold 3 is brought into contact with the resin 56 and acquires measurement information so as to transmit the measurement information as an electrical signal to the pressure adjusting device 83. In the present embodiment, a description will be given by taking an example in which the resin range measuring device 81 is applied to the first embodiment. Thus, an imprint apparatus may be provided that may reduce the amount of air bubbles entrapped during a mold contacting operation as in the first embodiment and reduce the collapse of the pattern during a mold releasing operation.

Figures 6A, 6B:
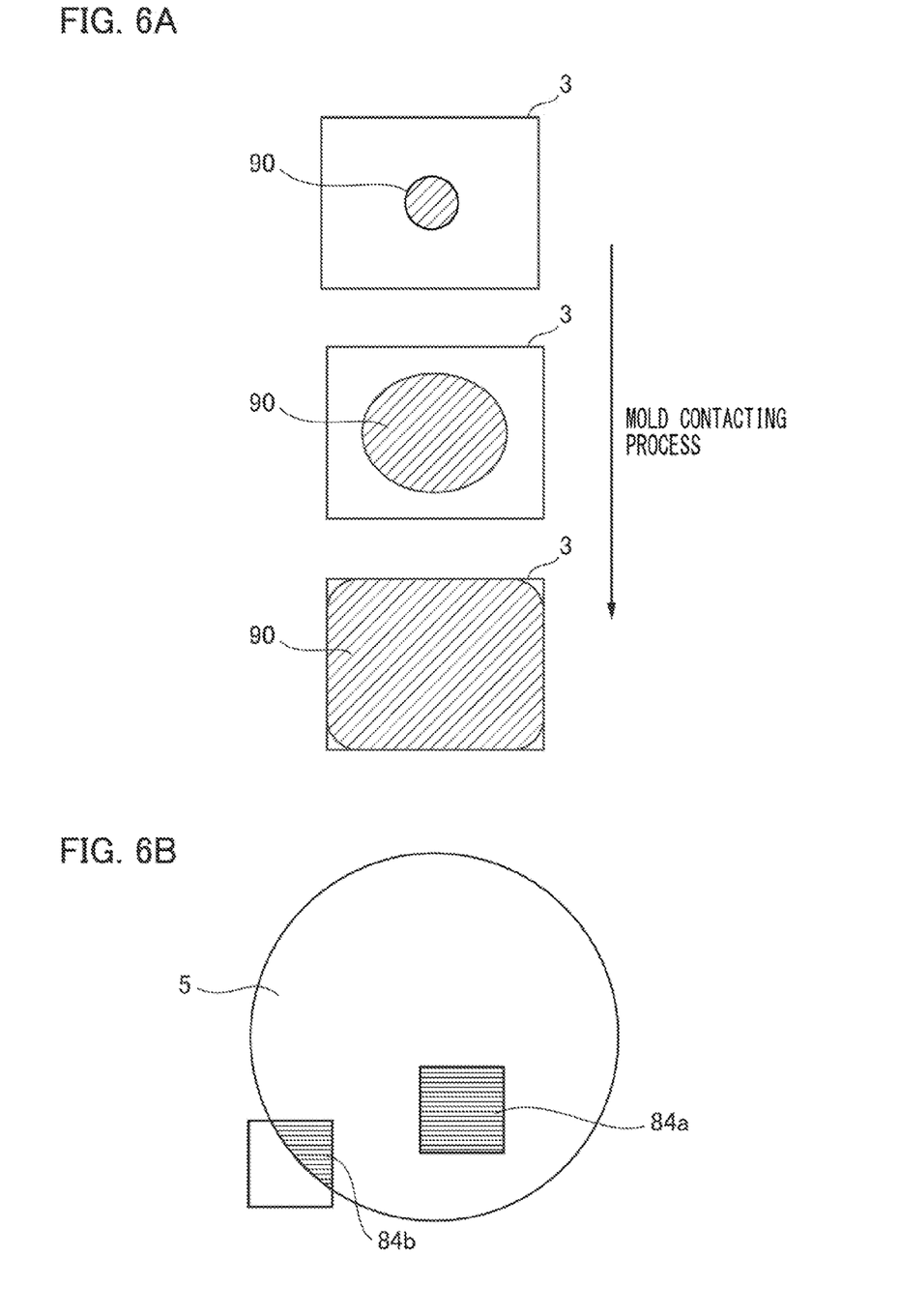
FIG. 6A is a plan view illustrating how the contact area between a mold and a resin changes during an imprint process.
FIG. 6B is a plan view illustrating the surface of a wafer on which a resin is applied as viewed from the mold side.

Each of FIG. 6A and FIG. 6B is a plan view illustrating the state of the resin 56 in the present embodiment. Firstly, FIG. 6A is a plan view illustrating how the contact area between the mold 3 and the resin 56 gradually increases during a mold contacting process. The resin range measuring device 81 measures the contact area 90 between the mold 3 and the resin 56 during a mold contacting process. Measurement information is transmitted to the pressure adjusting device 83 in conjunction with the measurement information acquired by the distortion measuring device 53. The pressure adjusting device 83 adjusts the pressure in the space area "A" based on these measurement information such that the mold 3 is maintained so as to be convex toward the wafer 5. With this arrangement, the mold 3 and the resin 56 may be successively brought into contact with each other from the center of the mold 3 to outward as shown in FIG. 6A.

On the other hand, FIG. 6B is a plan view illustrating the surface of the wafer 5 on which the resin 56 is applied as viewed from the mold 3 side. In FIG. 6B, each of a first area 84*a* and a second area 84*b* shows the application range of the resin 56 when a pattern is formed at the position inside the surface of the wafer 5 and at the position of the outer peripheral portion of the surface thereof. In the areas 84*a* and 84*b*, a rectangular portion represents the area at which the concave and convex pattern of the mold 3 is formed, and a shading portion represent the application range of the resin 56. Here, the second area 84*b*, which is the application range (application area) of the resin 56, is smaller than the first area 84*a*. Thus, when the imprint apparatus 1 performs imprinting processing to the position of the second area 84*b*, the pulling force to which the mold 3 is subject is small during a mold releasing operation, that is, distortion that occurs at the mold 3 is small. Hence, the resin range measuring device 81 measures the application range of the resin 56, and transmits the measurement information to the pressure adjusting device 83 in conjunction with the measurement information acquired by the distortion measuring device 53. Next, in response to these two units of measurement information, the pressure adjusting device 83 evacuates gas from the space area "A" so as to reduce the back pressure of the mold 3. In other words, during a mold releasing operation, the pressure adjusting device 83 may adjust the pressure in the space area "A" so as to reduce the amount of reduced pressure when the application range to be measured by the resin range measuring device 81 is small. Other operations performed by the mold deformation mechanism 82 are similar to those performed by the mold deformation mechanism 50 of the first embodiment. As described above, according to an imprint apparatus including the mold holding device 80 of the present embodiment, the same effects as those of the imprint apparatus of the first embodiment may be provided more efficiently. While, in the present embodiment, the resin range measuring device 81 is combined with the mold deformation mechanism 50 of the first embodiment, the resin range measuring device 81 may also be combined with the mold deformation mechanism of the second and third embodiments.

For example, in the embodiment described above, a pressure adjusting device controls deformation of a mold based on the measurement information acquired by the measuring device provided in each of the mold deformation mechanisms. Here, if the configurations of the mold holding devices and the condition of the steps that occur during an imprint processing and the like remain constant, deformation of a mold during a mold releasing operation correlates with the relative distance between a mold and a wafer. Thus, a relative distance measuring device for measuring the relative distance is installed on a mold deformation mechanism, and a pressure adjusting device may calculate a pressure adjustment value for the measured relative distance in advance and then control the pressure in the space area based on the measurement result of the relative distance. The addition of the relative distance measuring device to the mold deformation mechanism of the embodiments described above allows the deformation of a mold to be suppressed by changing the relative motion speed between a mold and a wafer separately when the response speed of the pressure adjusting device does not catch up with the delamination speed during a mold releasing operation.

In the embodiment described above, the measuring devices and the pressure measuring devices are connected via a line. However, the measurement result may be transmitted to the pressure measuring device by disposing a wireless unit, which is driven by a separately-provided battery (power source), on a mold. Furthermore, in order to control the pressure in the space area more strictly, a plurality of the measuring devices of the embodiment may be combined for usage.

(Article Manufacturing Method)

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching. The article manufacturing method of this embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2010-228830 filed Oct. 8, 2010 and No. 2011-157719 filed Jul. 19, 2011 which are hereby incorporated by reference herein in their entirety.

What is claimed is:

1. An imprint apparatus that molds an imprint material on a substrate using a mold and cures the imprint material to form a pattern on the substrate, the apparatus comprising:
a holder configured to attract the mold to hold the mold; and
a pressure reduction device configured to reduce a back pressure of the mold held by the holder,
wherein the pressure reduction device is configured to reduce the back pressure in parallel with release of the mold from the imprint material to reduce deformation of the mold associated with the release.

2. The apparatus according to claim 1, further comprising:
a deformation mechanism configured to deform the mold so that the mold becomes convex toward the imprint material,
wherein the mold is brought into contact with the imprint material in a state in which the mold is deformed by the deformation mechanism.

3. The apparatus according to claim 2, wherein the deformation mechanism is configured to deform the mold by rendering the back pressure at a positive pressure.

4. The apparatus according to claim 1, further comprising:
a measuring device configured to measure a physical quantity correlated with a deformation of the mold,
wherein the pressure reduction device is configured to reduce the back pressure based on an output of the measuring device.

5. The apparatus according to claim 4, wherein the measuring device is configured to measure at least one of a strain of the mold, a displacement of a surface of the mold, a back pressure of the mold, or a distance between the substrate and the mold.

6. The apparatus according to claim 1, wherein the pressure reduction device is configured to reduce the back pressure further based on an area of the imprint material, on the substrate, from which the mold is released.

7. The apparatus according to claim 6, further comprising a device configured to measure the area.

8. The apparatus according to claim 4, wherein the apparatus is configured to control a force applied to the mold for release of the mold based on the output of the measuring device.

9. The apparatus according to claim 1, wherein the the mold has a mesa portion that has a pattern for molding the imprint material, the mesa portion being thinner than the other portion included in the mold.

10. An imprint apparatus that molds an imprint material on a substrate using a mold to form a pattern on the substrate, the apparatus comprising:
a holder configured to attract the mold to hold the mold;
a measuring device configured to measure a physical quantity correlated with a deformation of the mold; and
an adjusting device configured to adjust a back pressure of the mold held by the holder based on an output of the measuring device in parallel with release of the mold to reduce deformation of the mold associated with the release.

11. The apparatus according to claim 10, wherein the measuring device is configured to measure at least one of a strain of the mold, a displacement of a surface of the mold, a back pressure of the mold, a distance between the substrate and the mold, or a region of the mold contacted with the imprint material.

12. The apparatus according to claim 10, wherein the mold includes a mesa portion that has a pattern for molding the imprint material, the mesa portion being thinner than the other portion included in the mold.

13. An imprint apparatus that molds an imprint material on a substrate using a mold to form a pattern on the substrate, the apparatus comprising:
a mold holder configured to attract the mold to hold the mold;
a substrate holder configured to attract the substrate to hold the substrate; and
a measuring device configured to measure a physical quantity correlated with a deformation of the mold;
a pressure reduction device configured to reduce a gas pressure in a space between the mold held by the mold holder and the substrate held by the substrate holder; and
a driving mechanism configured to control an amount or rate of relative movement between the mold holder and the substrate holder in parallel with contacting of the mold with the imprint material based on an output of the measuring device to keep the mold convex toward the substrate while the gas pressure is reduced by the pressure reduction device.

14. An imprint apparatus that molds an imprint material on a substrate using a mold to form a pattern on the substrate, the apparatus comprising:
a mold holder configured to attract the mold to hold the mold;
a substrate holder configured to attract the substrate to hold the substrate;
a measuring device configured to measure a physical quantity correlated with a deformation of the mold;
a pressure reduction device configured to reduce a gas pressure in a space between the mold held by the mold holder and the substrate held by the substrate holder; and
a pressure adjusting device configured to control the gas pressure reduced by the pressure reduction device in parallel with contacting of the mold with the imprint material based on an output of the measuring device to keep the mold convex toward the substrate, while the gas pressure is reduced by the pressure reduction device.

15. The apparatus according to claim 14, the pressure reduction device is configured to adjust a flow rate of a gas exhausted from the space based on the output of the measuring device.

16. The apparatus according to claim 14, further comprising:
a supply device configured to supply a gas to the space, wherein the pressure reduction device is configured to adjust a flow rate of the gas supplied to the space by the supply device based on the output of the measuring device to keep the mold convex toward the substrate.

17. The apparatus according to claim 14, wherein the measuring device is configured to measures at least one of a strain of the mold, a displacement of a surface of the mold, a back pressure of the mold, a distance between the substrate and the mold, or a region of the mold in contact with the imprint material.

18. The apparatus according to claim 14, wherein the mold includes a mesa portion that has a pattern for molding the imprint material, the mesa portion being thinner than the other portion included in the mold.

19. A method of manufacturing an article, the method comprising the steps of:
   forming a pattern on a substrate using the imprint apparatus defined in claim 1; and
   etching the substrate, on which the pattern has been formed, to manufacture the article.

20. A method of manufacturing an article, the method comprising the steps of:
   forming a pattern on a substrate using the imprint apparatus defined in claim 10; and
   etching the substrate, on which the pattern has been formed, to manufacture the article.

21. A method of manufacturing an article, the method comprising the steps of:
   forming a pattern on a substrate using the imprint apparatus defined in claim 13; and
   etching the substrate, on which the pattern has been formed, to manufacture the article.

22. A method of manufacturing an article, the method comprising the steps of:
   forming a pattern on a substrate using the imprint apparatus defined in claim 14; and
   etching the substrate, on which the pattern has been formed, to manufacture the article.

23. An imprint apparatus that molds an imprint material on a substrate using a mold to form a pattern on the substrate, the apparatus comprising:
   a mold holder configured to attract the mold to hold the mold;
   a substrate holder configured to attract the substrate to hold the substrate;
   a measuring device configured to measure a physical quantity correlated with a deformation of the mold;
   an adjusting device configured to adjust a back pressure of the mold held by the holder based on an output of the measuring device; and
   a pressure reduction device configured to reduce a gas pressure in a space between the mold held by the mold holder held by the mold holder and the substrate held by the substrate holder; and
   wherein the adjusting device is configured to adjust the back pressure in parallel with contacting of the mold with the imprint material based on an output of the measuring device to keep the mold convex toward the substrate while the pressure reduction device reduces the gas pressure.

* * * * *